(12) United States Patent
Liu et al.

(10) Patent No.: US 7,511,556 B2
(45) Date of Patent: Mar. 31, 2009

(54) MULTI-FUNCTION CIRCUIT MODULE HAVING VOLTAGE LEVEL SHIFTING FUNCTION AND DATA LATCHING FUNCTION

(75) Inventors: Ming-Huang Liu, Taipei Hsien (TW);
Wei-Shan Chiang, Tai-Chung (TW);
Chen-Hsien Han, Hsinchu (TW);
Chi-Mo Huang, Hsin-Chu (TW)

(73) Assignee: ILI Technology Corp., Jhubei, Hsinchu County (TW)

( * ) Notice: Subject to any disclaimer, the term of this patent is extended or adjusted under 35 U.S.C. 154(b) by 0 days.

(21) Appl. No.: 11/844,358

(22) Filed: Aug. 24, 2007

(65) Prior Publication Data

US 2009/0051402 A1    Feb. 26, 2009

(51) Int. Cl.
*H02L 5/00* (2006.01)

(52) U.S. Cl. .............................. 327/333; 326/62; 326/81

(58) Field of Classification Search ............. 326/62–63, 326/80–81; 327/306, 333
See application file for complete search history.

(56) References Cited

U.S. PATENT DOCUMENTS

| | | | | |
|---|---|---|---|---|
| 5,659,258 A | * | 8/1997 | Tanabe et al. ................. | 326/68 |
| 5,825,205 A | * | 10/1998 | Ohtsuka ....................... | 326/81 |
| 5,903,171 A | * | 5/1999 | Shieh .......................... | 327/55 |
| 6,333,662 B1 | * | 12/2001 | Umezawa et al. ........... | 327/333 |
| 6,351,173 B1 | * | 2/2002 | Ovens et al. ................ | 327/333 |
| 6,762,957 B2 | * | 7/2004 | Hsu et al. .............. | 365/189.05 |
| 7,196,699 B1 | * | 3/2007 | Kubota et al. ............... | 345/211 |

* cited by examiner

*Primary Examiner*—Dinh T. Le
(74) *Attorney, Agent, or Firm*—Winston Hsu

(57) ABSTRACT

The present invention discloses a multi-function circuit module having voltage level shifting function and data latching function via switching a plurality of switch elements. The multi-function circuit module includes a first circuit module, a fourth switch element, and a fifth switch module, wherein the first circuit module further includes a first switch module, a second switch module, and a third switch module. The multi-function circuit module can substantially reduce the circuit layout area. For example, when the multi-function circuit module of the present invention is applied in a source driving chip circuit, the multi-function circuit module can replace the original low-to-high voltage level shifting circuit and data latching circuit, so as to attain the purpose of reducing the chip area.

18 Claims, 7 Drawing Sheets

MULTI-FUNCTION CIRCUIT MODULE HAVING VOLTAGE LEVEL SHIFTING FUNCTION AND DATA LATCHING FUNCTION

BACKGROUND OF THE INVENTION

1. Field of the Invention

The present invention relates to a multi-function circuit module having a voltage level shifting function and a data latching function, and more particularly, to a multi-function circuit module having a voltage level shifting function and a data latching function via switching a plurality of switch elements.

2. Description of the Prior Art

Please refer to FIG. 1. FIG. 1 shows a simplified block diagram of a conventional source driving chip circuit 10 and a LCD device 20 according to a prior art. As shown in FIG. 1, in the conventional source driving chip circuit 10, display data will be transmitted through two data latching circuit, that is, a sample register 30 and a data latch circuit 100, and then the display data will be transmitted to a digital-to-analog converter 40 (DAC) via a level shifting circuit 200, and the converted analog voltage will be transmitted to the LCD device 20 by an OPAMP Buffer 50 in the end.

Please refer to FIG. 2 and FIG. 3. FIG. 2 shows a simplified circuit configuration diagram of the data latch circuit 100 shown in FIG. 1 according to the prior art. FIG. 3 shows a simplified circuit configuration diagram of the level shifting circuit 200 shown in FIG. 1 according to the prior art. As shown in FIG. 2 and FIG. 3, the data latch circuit 100 includes a first switch element 110, a second switch element 112, a first inverting element 120, and a second inverting element 122, and the level shifting circuit 200 includes a first switch element 210, a second switch element 212, a third switch element 220, a fourth switch element 222, a fifth switch element 230, and a sixth switch element 232. A voltage level of a signal required to be latched is inputted from an input node LATCH_IN, and the data latch circuit 100 will respectively generate a first input signal and a second input signal reverse to the first input signal at a first output node LATCH_OUT_P and a second output node LATCH_OUT_N, and the first input signal and the second input signal will be inputted respectively to a first signal receiving node LSH_IN_P and a second signal receiving node LSH_IN_N of the level shifting circuit 200. Next, the voltage level of the latched input signal will be pulled up to VDDA and VSSA via the circuit made up by the first switch element 210, the second switch element 212, the third switch element 220, the fourth switch element 222, the fifth switch element 230, and the sixth switch element 232, and the latched input signal after being pulled up will be outputted from a first signal outputting node LSH_OUT_P and a second signal outputting node LSH_OUT_N of the level shifting circuit 200.

However, it is very obvious that the conventional circuit design mentioned above needs a larger circuit layout area, and thus the conventional circuit design does not fit in with the trend of reducing the chip area as much as possible and the requirement of reducing fabrication cost of the chip.

SUMMARY OF THE INVENTION

It is therefore one of the objectives of the present invention to provide a multi-function circuit module having a voltage level shifting function and a data latching function to solve the above problem.

According to an embodiment of the present invention, a multi-function circuit module having a voltage level shifting function and a data latching function is disclosed. The multi-function circuit module includes a first circuit module, a fourth switch module, and a fifth switch module, wherein the first circuit module further includes a first switch module, a second switch module, and a third switch module. The first switch module is utilized for selectively coupling a first voltage source to a first node or a second node, and the second switch module is utilized for selectively coupling a third node to the first node or the second node, and the third switch module is utilized for receiving at least an input signal and selectively coupling a fourth node to the first node or the second node. The fourth switch module is coupled between the fourth node and a second voltage source, and is utilized for receiving a first control signal and selectively conducting the fourth node and the second voltage source according to the first control signal, wherein when the fourth switch module conducts the fourth node and the second voltage source, the first switch module, the third switch module, and the fourth switch module make up a voltage level shifting circuit to respectively adjust voltage levels of the first node and (or) the second node, so as to generate at least an output signal; and the fifth switch module is coupled between the third node and the second voltage source, and is utilized for receiving a second control signal and selectively conducting the third node and the second voltage source according to the second control signal, wherein when the fifth switch module conducts the third node and the second voltage source, the first switch module, the second switch module, and the fifth switch module make up a data latching circuit to latch the voltage levels of the first node and the second node.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and the claims to refer to particular components. As one skilled in the art will appreciate, hardware manufacturers may refer to a component by different names. This document does not intend to distinguish between components that differ in name but in function. In the following discussion and in the claims, the terms "include", "including", "comprise", and "comprising" are used in an open-ended fashion, and thus should be interpreted to mean "including, but not limited to . . . ". The terms "couple" and "coupled" are intended to mean either an indirect or a direct electrical connection. Thus, if a first device couples to a second device, that connection may be through a direct electrical connection, or through an indirect electrical connection via other devices and connections.

Figure 1:
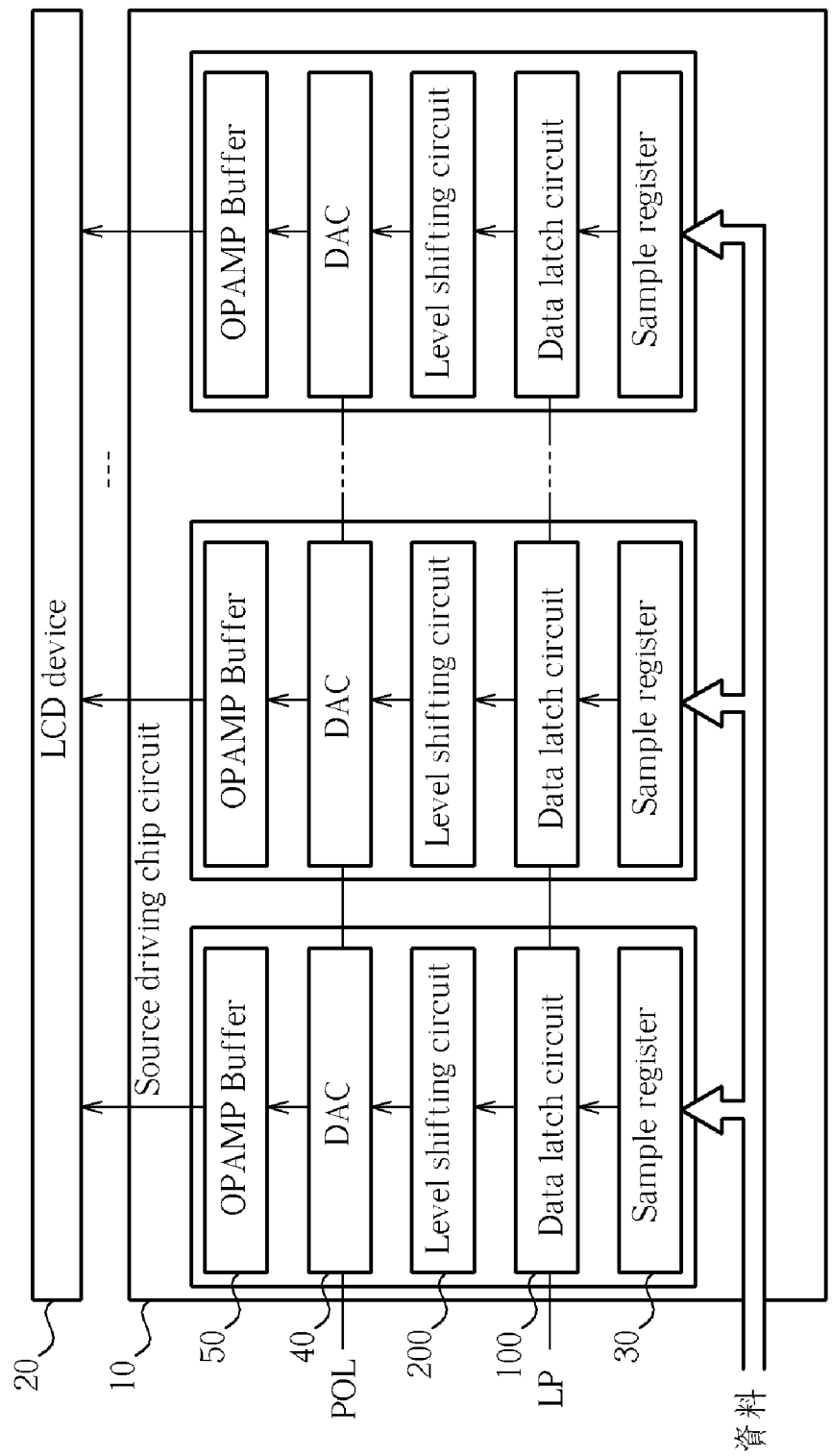
FIG. 1 shows a simplified block diagram of a conventional source driving chip circuit and a LCD device according to a prior art.
Figure 2:
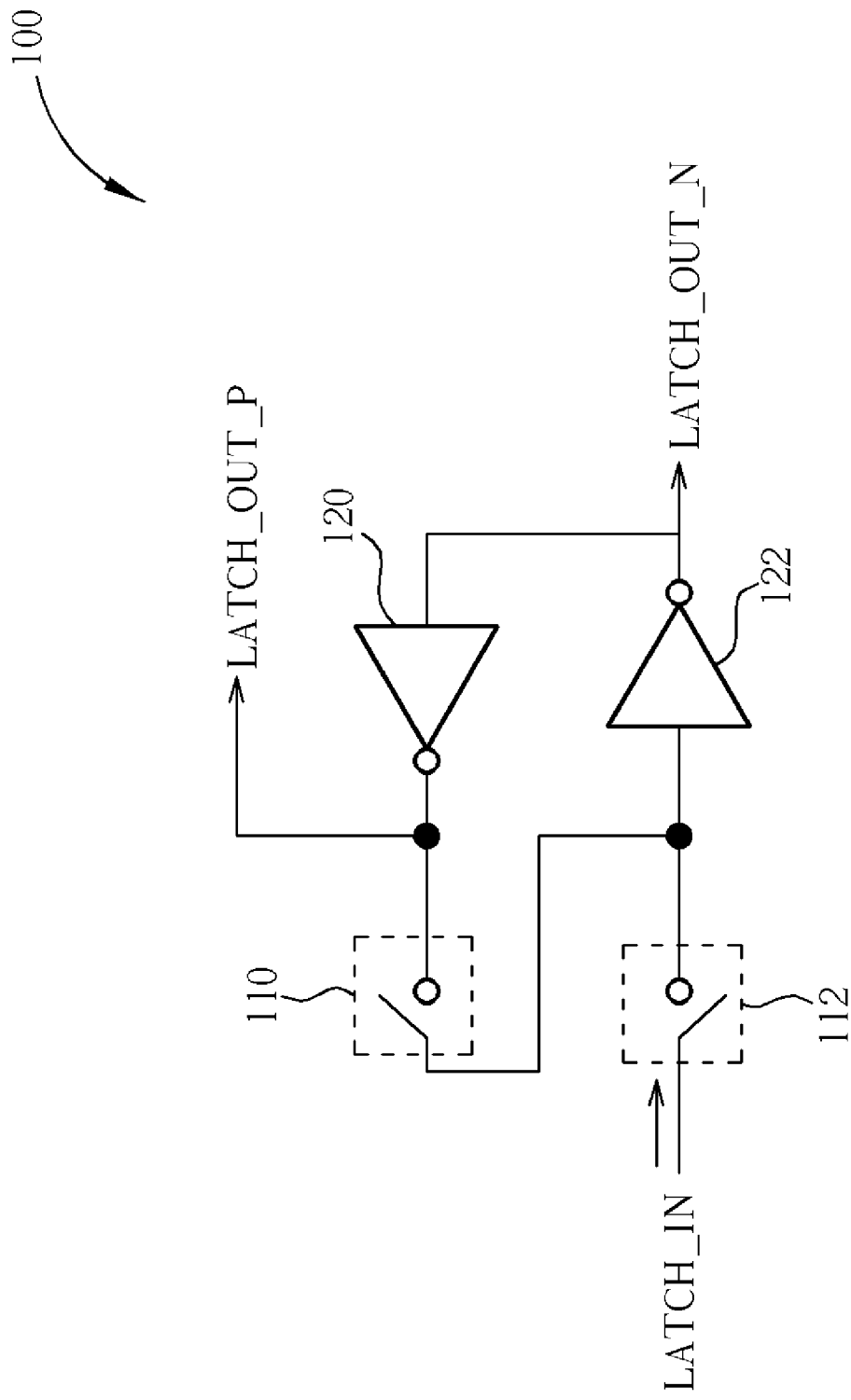
FIG. 2 shows a simplified circuit configuration diagram of the data latch circuit shown in FIG. 1 according to the prior art.
Figure 3:
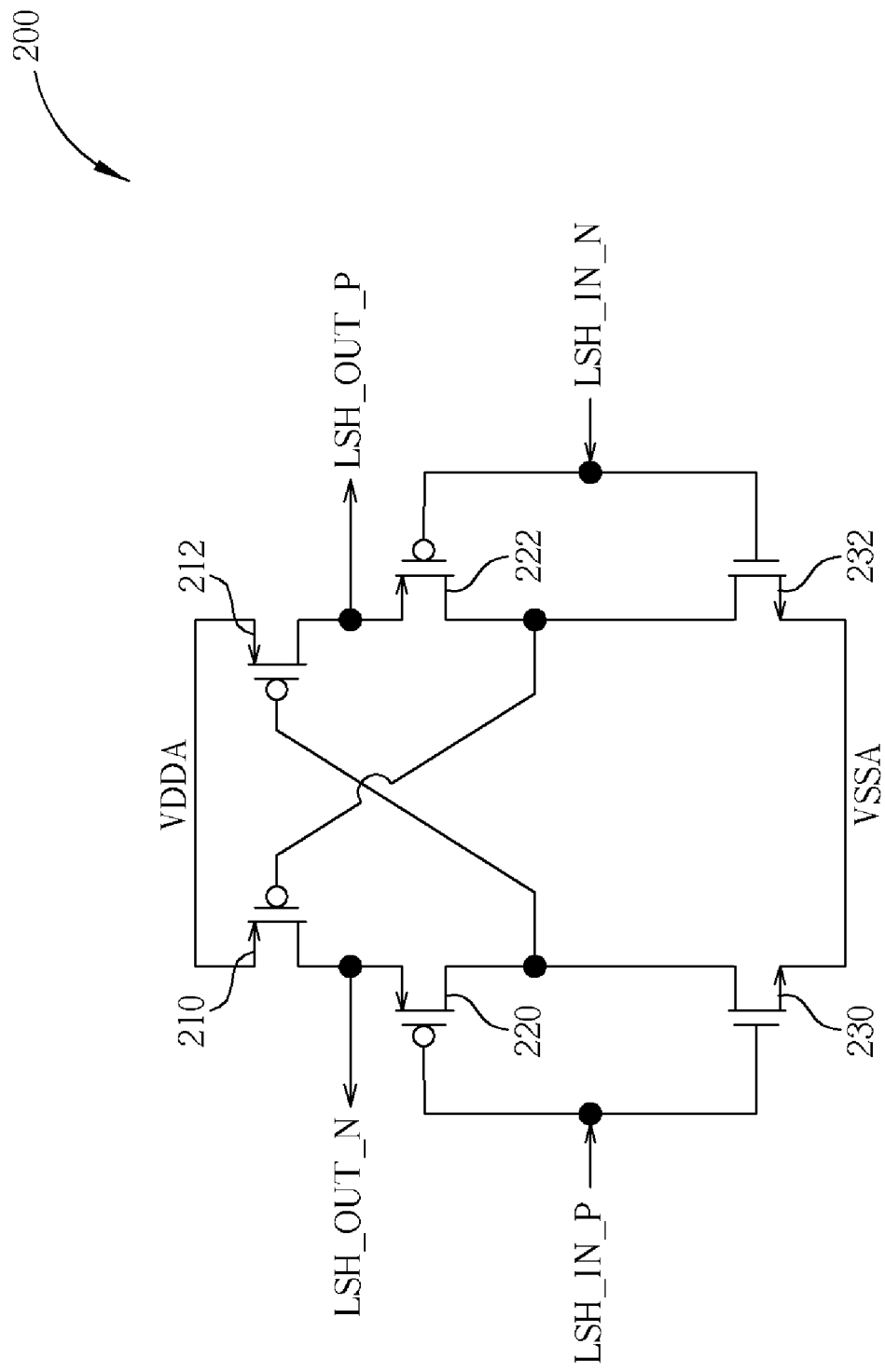
FIG. 3 shows a simplified circuit configuration diagram of the level shifting circuit shown in FIG. 1 according to the prior art.
Figure 4:
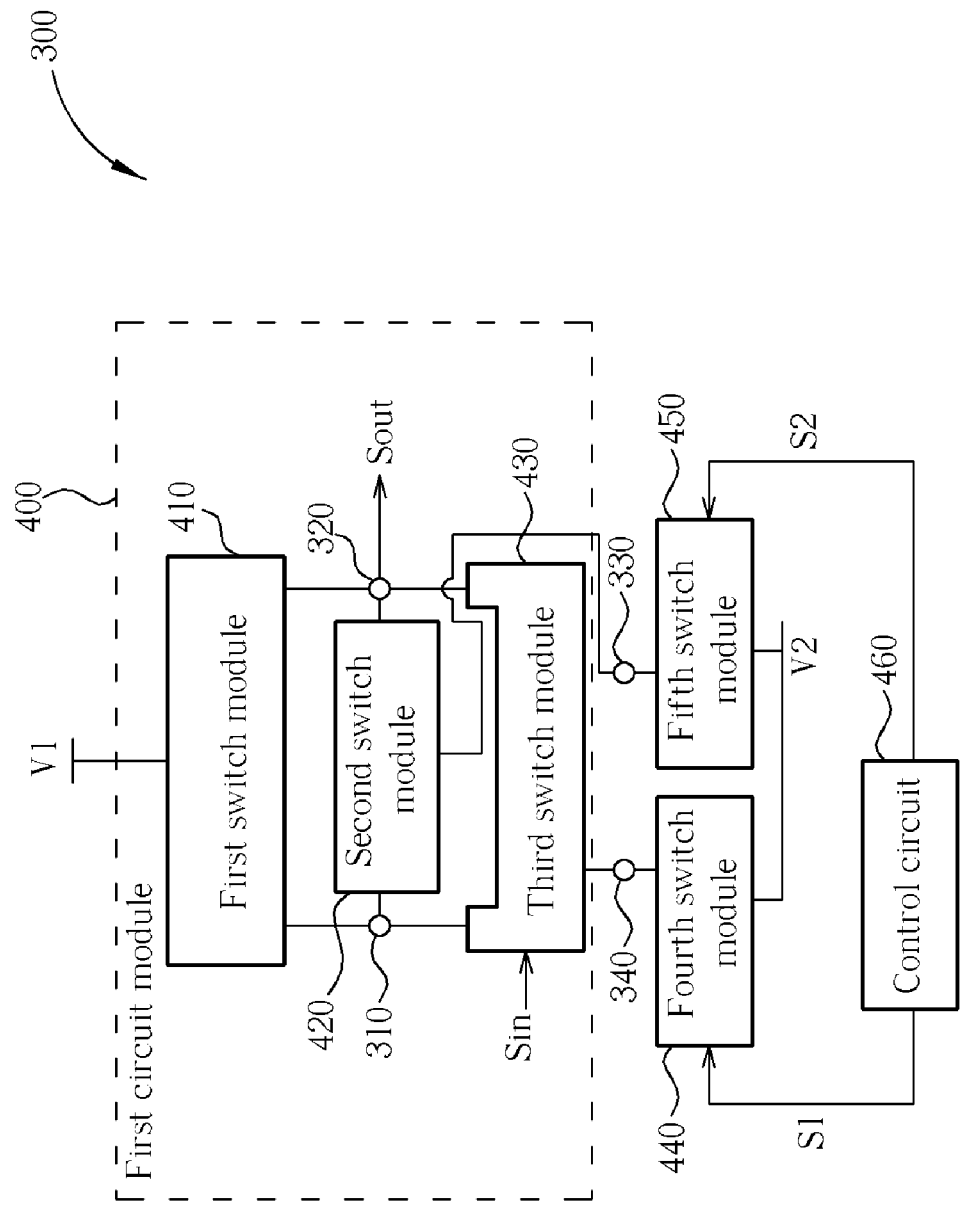
FIG. 4 shows a simplified block diagram of a multi-function circuit module according to a first embodiment of the present invention.

Please refer to FIG. 4. FIG. 4 shows a simplified block diagram of a multi-function circuit module 300 according to a first embodiment of the present invention. As shown in FIG. 4, the multi-function circuit module 300 includes a first circuit module 400, a fourth switch module 440, a fifth switch module 450, and a control circuit 460 wherein the first circuit module 400 further includes a first switch module 410, a second switch module 420, and a third switch module 430. The first switch module 410 is utilized for selectively coupling a first voltage source V1 to a first node 310 or a second node 320, and the second switch module 420 is utilized for selectively coupling a third node 330 to the first node 310 or the second node 320, and the third switch module 430 is utilized for receiving an input signal Sin and selectively coupling a fourth node 340 to the first node 310 or the second node 320. The control circuit 460 is utilized for generating a first control signal S1 and a second control signal S2, and the fourth switch module 440 is coupled between the fourth node 340 and a second voltage source V2, and is utilized for receiving the first control signal S1 and selectively conducting the fourth node 340 and the second voltage source V2 according to the first control signal S1, wherein when the fourth switch module 440 conducts the fourth node 340 and the second voltage source V2, the first switch module 410, the third switch module 430, and the fourth switch module 440 will make up a voltage level shifting circuit to respectively adjust voltage levels of the first node 310 and (or) the second node 320, so as to generate an output signal Sout; and the fifth switch module 450 is coupled between the third node 330 and the second voltage source V2, and is utilized for receiving the second control signal S2 and selectively conducting the third node 330 and the second voltage source V2 according to the second control signal S2, wherein when the fifth switch module 450 conducts the third node 330 and the second voltage source V2, the first switch module 410, the second switch module 420, and the fifth switch module 450 will make up a data latching circuit to latch the voltage levels of the first node 310 and the second node 320. In addition, the voltage level shifting circuit can be a voltage level pull-up circuit, and the voltage level of the first voltage source V1 is higher than the voltage level of the second voltage source V2. Please note herein that the above embodiment is only for illustration purposes and is not meant to be a limitation of the present invention. Next, this document will illustrate the details of the circuit configuration and the operational scheme of the multi-function circuit module 300 according to the first embodiment of the present invention.

Figure 5:
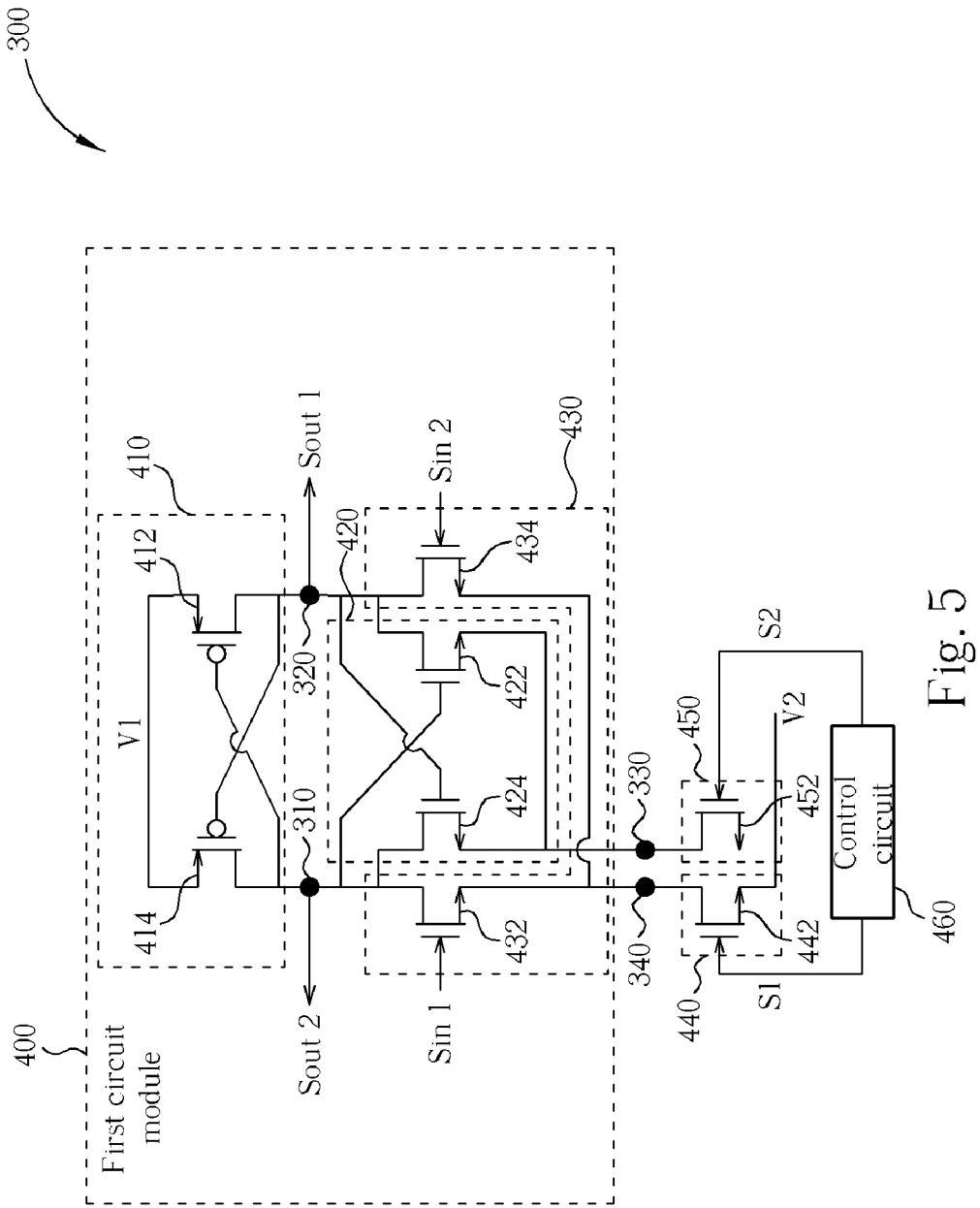
FIG. 5 shows a simplified circuit configuration diagram of the multi-function circuit module shown in FIG. 4 according to an embodiment of the present invention.

Please refer to FIG. 5. FIG. 5 shows a simplified circuit configuration diagram of the multi-function circuit module 300 shown in FIG. 4 according to an embodiment of the present invention. As shown in FIG. 5, the input signal Sin can include a first input signal Sin1 and a second input signal Sin2 reverse to the first input signal Sin1, and the first circuit module 410 can include a first switch element 412 and a second switch element 414. The second switch module 420 can include a third switch element 422 and a fourth switch element 424, and the third switch module 430 can include a fifth switch element 432 and a sixth switch element 434. The fourth switch module 440 can include a seventh switch element 442 and the fifth switch module 450 can include an eighth switch element 452. In addition, the first switch element 412 and the second switch element 414 both are P-type FETs (such as PMOSFETs), and the third switch element 422, the fourth switch element 424, the fifth switch element 432, the sixth switch element 434, the seventh switch element 442, and the eighth switch element 452 all are N-type FETs (such as NMOSFETs) in the circuit configuration of this embodiment. The first switch element 412 has a control terminal (i.e. a gate terminal) coupled to the first node 310, a first terminal (i.e. a source terminal) coupled to the first voltage source V1, and a second terminal (i.e. a drain terminal) coupled to the second node 320. The second switch element 414 has a control terminal (i.e. a gate terminal) coupled to the second node 320, a first terminal (i.e. a source terminal) coupled to the first voltage source, and a second terminal (i.e. a drain terminal) coupled to the first node 310. The third switch element 422 has a control terminal (i.e. a gate terminal) coupled to the first node 310, a first terminal (i.e. a source terminal) coupled to the third node 330, and a second terminal (i.e. a drain terminal) coupled to the second node 320. The fourth switch element 424 has a control terminal (i.e. a gate terminal) coupled to the second node 320, a first terminal (i.e. a source terminal) coupled to the third node 330, and a second terminal (i.e. a drain terminal) coupled to the first node 310. The fifth switch element 432 has a control terminal (i.e. a gate terminal) coupled to the first input signal Sin1, a first terminal (i.e. a source terminal) coupled to the fourth node, and a second terminal (i.e. a drain terminal) coupled to the first node 310. The sixth switch element 434 has a control terminal (i.e. a gate terminal) coupled to the second input signal Sin2, a first terminal (i.e. a source terminal) coupled to the fourth node, and a second terminal (i.e. a drain terminal) coupled to the second node 320. The seventh switch element 442 has a control terminal (i.e. a gate terminal) coupled to the first control signal, a first terminal (i.e. a source terminal) coupled to the second voltage source V2, and a second terminal (i.e. a drain terminal) coupled to the fourth node. The eighth switch element 452 has a control terminal (i.e. a gate terminal) coupled to the second control signal S2, a first terminal (i.e. a source terminal) coupled to the second voltage source V2, and a second terminal (i.e. a drain terminal) coupled to the third node 330. Please note herein that the above embodiment is only for illustration purposes and is not meant to be a limitation of the present invention. For example, the seventh switch element 442 and the eighth switch element 452 can be replaced by the P-type FETs (such as the PMOSFETs) in another embodiment of the present invention, or the seventh switch element 442 can be the N-type FET (such as the NMOSFET) and the eighth switch element 452 can be the P-type FET (such as the PMOSFET) in one another embodiment of the present invention. In any case, various modifications and alterations of the device and method should fall into the disclosed scope of the present invention as long as the performances and functions of the multi-function circuit module having voltage level shifting function and data latching function disclosed by the present invention can be attained.

Figure 6:
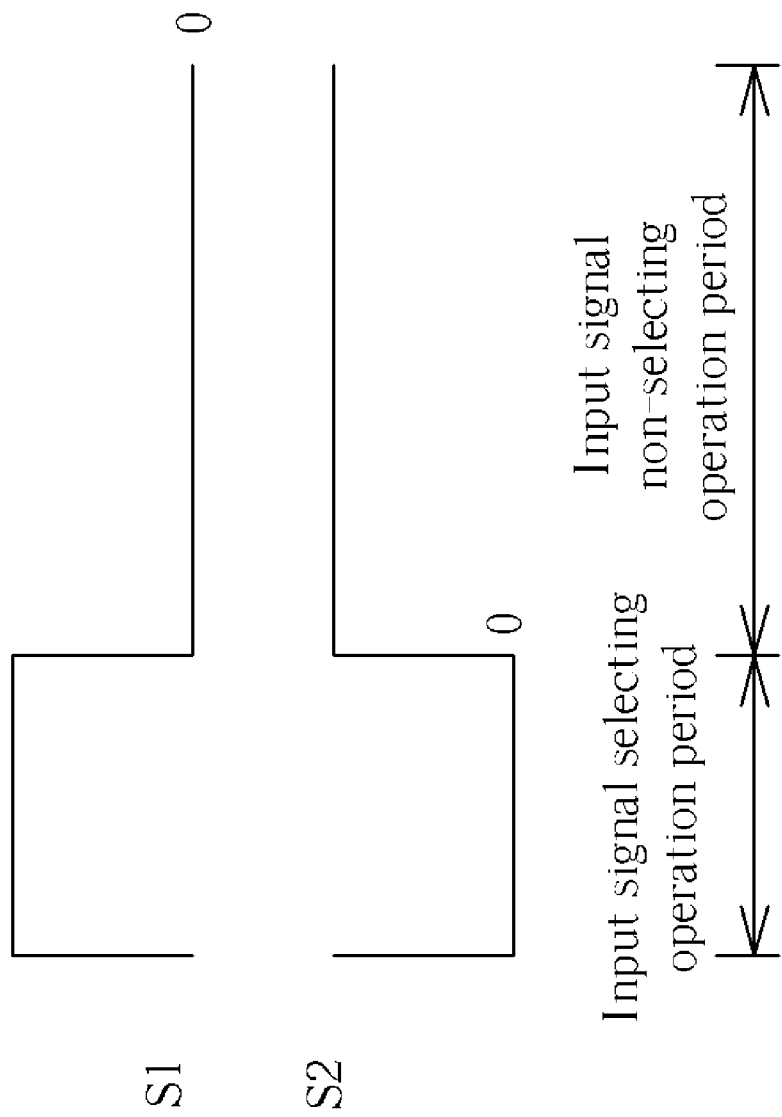
FIG. 6 shows a simplified timing diagram of the first control signal S1 and the second control signal S2 shown in FIG. 5 according to an embodiment of the present invention.

Next, please refer to FIG. 6. FIG. 6 shows a simplified timing diagram of the first control signal S1 and the second control signal S2 shown in FIG. 5 according to an embodiment of the present invention. As shown in FIG. 5, the first control signal S1 and the second control signal S2 are the supply voltage source signals that have the reverse phases. When the first input signal Sin1 and the second input signal Sin2 input a data (that is, when entering the period of the multi-function circuit module 300 performing an input signal selecting operation), the control circuit 460 firstly sets the first control signal S1 to conduct the seventh switch element 442 and sets the second control signal S2 to not conduct the eighth switch element 452 simultaneously to let the first switch module 410, the third switch module 430, and the fourth switch module 440 (that is, the first switch element 412, the second switch element 414, the fifth switch element 432, the sixth switch element 434, and the seventh switch element 442) make up a voltage level shifting circuit, so as to respectively pull up the voltage levels of the second node 320 and the first node 310, so as to respectively generate a first output signal Sout1 and a second output signal Sout2. Next, after the multi-function circuit module 300 has completely received the data (that is, when entering the period of the multi-function circuit module 300 performing an input signal non-selecting operation), the control circuit 460 will set the second control signal S2 to conduct the eighth switch element 452 and set the first control signal S1 to not conduct the seventh switch element 442 simultaneously to let the first switch module 410, the second switch module 420, and the fifth switch module 450 (that is, the first switch element 412, the second switch element 414, the third switch element 422, the fourth switch element 424, and the eighth switch element 452) to make up a data latching circuit having a first inverting element (that is, the first switch element 412 and the third switch element 422) and a second inverting element (that is, the second switch element 414 and the fourth switch element 424), so as to latch the voltage levels of the first node 310 and the second node 320. Please note herein that the above embodiment is only for illustration purposes and is not meant to be a limitation of the present invention. For example, when the seventh switch element 442 is the N-type FET (such as the NMOSFET) and the eighth switch element 452 is the P-type FET (such as the PMOSFET) in another embodiment of the present invention, then the first control signal S1 and the second control signal S2 have to be the supply voltage source signals that have the same phases, or the second control signal S2 has to be replaced by the first control signal S1. In any case, various modifications and alterations of the device and method should fall into the disclosed scope of the present invention as long as the performances and functions of the multi-function circuit module having voltage level shifting function and data latching function disclosed by the present invention can be attained.

Figure 7:
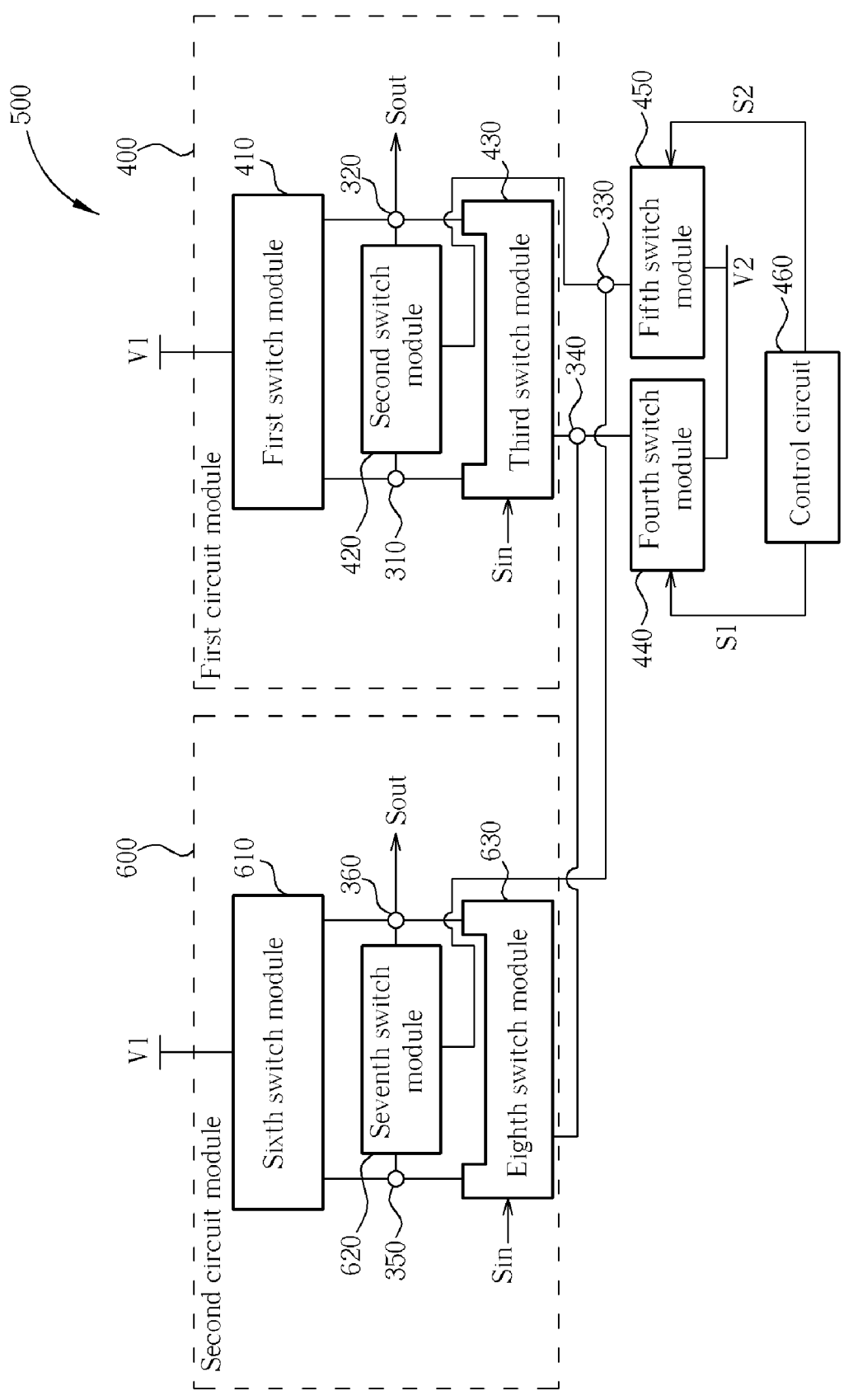
FIG. 7 shows a simplified block diagram of a multi-function circuit module according to a second embodiment of the present invention.

Please refer to FIG. 7. FIG. 7 shows a simplified block diagram of a multi-function circuit module 500 according to a second embodiment of the present invention. As shown in FIG. 7, the multi-function circuit module 500 includes the first circuit module 400, the fourth switch module 440, the fifth switch module 450, and the control circuit 460 that are the same as those shown in FIG. 4 (i.e. the first embodiment of the present invention), and a second circuit module 600, wherein due to the configuration details related to the first circuit module 400, the fourth switch module 440, the fifth switch module 450, and the control circuit 460 are all well illustrated in the above paragraphs, thus the further explanations of the configuration details of the first circuit module 400, the fourth switch module 440, the fifth switch module 450, and the control circuit 460 are omitted herein for the sake of brevity. The second circuit module 600 further includes a sixth switch module 610, a seventh switch module 620, and an eighth switch module 630, wherein the sixth switch module 610 is utilized for selectively coupling the first voltage source V1 to a fifth node 350 or a sixth node 360; the seventh switch module 620 is utilized for selectively coupling the third node 330 to the fifth node 350 or the sixth node 360; and the eighth switch module 630 is utilized for receiving the an input signal Sin and selectively coupling the fourth node to the fifth node 350 or the sixth node 360. The control circuit 460 is utilized for generating a first control signal S1 and a second control signal S2, and the fourth switch module 440 is coupled between the fourth node 340 and a second voltage source V2, and is utilized for receiving the first control signal S1 and selectively conducting the fourth node 340 and the second voltage source V2 according to the first control signal S1, wherein when the fourth switch module 440 conducts the fourth node 340 and the second voltage source V2, the sixth switch module 610, the eighth switch module 630, and the fourth switch module 440 will make up a voltage level shifting circuit to respectively adjust voltage levels of the fifth node 350 and (or) the sixth node 360, so as to generate an output signal Sout. The fifth switch module 450 is coupled between the third node 330 and the second voltage source V2, and is utilized for receiving the second control signal S2 and selectively conducting the third node 330 and the second voltage source V2 according to the second control signal S2, wherein when the fifth switch module 450 conducts the third node 330 and the second voltage source V2, the sixth switch module 610, the seventh switch module 620, and the fifth switch module 450 will make up a data latching circuit to latch the voltage levels of the fifth node 350 and the sixth node 360. In addition, the second circuit module 600 can be substantially the same as the second circuit module 400 shown in FIG. 4, and thus the voltage level shifting circuit also can be a voltage level pull-up circuit, and the voltage level of the first voltage source V1 is higher than the voltage level of the second voltage source V2. In the mean time, the details of the circuit configuration and the operational scheme of the second circuit module 600 also can be the same as the second circuit module 400 shown in FIG. 5, and thus the further explanations of the circuit configuration and the operational scheme of the first metal layer 300 are omitted herein for the sake of brevity. In addition, please note herein that the above embodiment is only for illustration purposes and is not meant to be a limitation of the present invention. For example, in the other embodiments similar with the connection scheme of the multi-function circuit module 500 according to the second embodiment of the present invention, the multi-function circuit module 500 also can further include a plurality of the first circuit module 400 and a plurality of the second circuit module 600.

Briefly summarized, the multi-function circuit module disclosed by the present invention is able to have the voltage level shifting function (such as the voltage level pull-up function) and the data latching function via switching a plurality of switch elements. Thus in a comparison with the conventional combination of the voltage level shifting circuit and the data latching circuit, the multi-function circuit module disclosed by the present invention can reduce the circuit layout area greatly. For example, when the multi-function circuit module of the present invention is applied in a source driving chip circuit for driving an LCD device, the original voltage level shifting circuit and the original data latching circuit in the source driving chip circuit can be replaced by the multi-function circuit module of the present invention, so as to attain the purpose of reducing the circuit layout area.

Those skilled in the art will readily observe that numerous modifications and alterations of the device and method may be made while retaining the teachings of the invention.

What is claimed is:

1. A multi-function circuit module having voltage level shifting function and data latching function, the multi-function circuit module comprising:
   a first circuit module, comprising:
      a first switch module, for selectively coupling a first voltage source to a first node or a second node;
      a second switch module, for selectively coupling a third node to the first node or the second node; and
      a third switch module, for receiving at least an input signal and selectively coupling a fourth node to the first node or the second node;
   a fourth switch module, coupled between the fourth node and a second voltage source, for receiving a first control signal and selectively conducting the fourth node and the second voltage source according to the first control signal, wherein when the fourth switch module conducts the fourth node and the second voltage source, the first switch module, the third switch module, and the fourth switch module act as a voltage level shifting circuit to respectively adjust voltage levels of the first node and/or the second node, so as to generate at least an output signal; and
   a fifth switch module, coupled between the third node and the second voltage source, for receiving a second control signal and selectively conducting the third node and the second voltage source according to the second control signal, wherein when the fifth switch module conducts the third node and the second voltage source, the first switch module, the second switch module, and the fifth switch module act as a data latching circuit to latch the voltage levels of the first node and the second node.

2. The multi-function circuit module of claim 1, wherein the input signal comprises a first input signal and a second input signal being an inverse of the first input signal; the first circuit module further comprises:
   a first switch element, having a control terminal coupled to the first node, a first terminal coupled to the first voltage source, and a second terminal coupled to the second node; and
   a second switch element, having a control terminal coupled to the second node, a first terminal coupled to the first voltage source, and a second terminal coupled to the first node;
   the second switch module further comprises:
   a third switch element, having a control terminal coupled to the first node, a first terminal coupled to the third node, and a second terminal coupled to the second node; and
   a fourth switch element, having a control terminal coupled to the second node, a first terminal coupled to the third node, and a second terminal coupled to the first node;
   the third switch module further comprises:
   a fifth switch element, having a control terminal coupled to the first input signal, a first terminal coupled to the fourth node, and a second terminal coupled to the first node; and
   a sixth switch element, having a control terminal coupled to the second input signal, a first terminal coupled to the fourth node, and a second terminal coupled to the second node;
   the fourth switch module further comprises:
   a seventh switch element, having a control terminal coupled to the first control signal, a first terminal coupled to the second voltage source, and a second terminal coupled to the fourth node; and
   the fifth switch module further comprises:
   an eighth switch element, having a control terminal coupled to the second control signal, a first terminal coupled to the second voltage source, and a second terminal coupled to the third node.

3. The multi-function circuit module of claim 2, wherein the first switch element, the second switch element, the third switch element, the fourth switch element, the fifth switch element, the sixth switch element, the seventh switch element, and the eighth switch element all are transistors.

4. The multi-function circuit module of claim 3, wherein the first switch element and the second switch element both are P-type FETs, and the third switch element, the fourth switch element, the fifth switch element, the sixth switch element, the seventh switch element, and the eighth switch element all are N-type FETs.

5. The multi-function circuit module of claim 3, wherein the first switch element, the second switch element, the seventh switch element, and the eighth switch element all are P-type FETs, and the third switch element, the fourth switch element, the fifth switch element, and the sixth switch element all are N-type FETs.

6. The multi-function circuit module of claim 3, wherein the first switch element, the second switch element, and the eighth switch element all are P-type FETs, and the third switch element, the fourth switch element, the fifth switch element, the sixth switch element, and the seventh switch element all are N-type FETs.

7. The multi-function circuit module of claim 2, further comprising:
   a plurality of second circuit modules, each comprising:
      a sixth switch module, for selectively coupling the first voltage source to a fifth node or a sixth node;
      a seventh switch module, for selectively coupling the third node to the fifth node or the sixth node; and
      an eighth switch module, for receiving the input signal and selectively coupling the fourth node to the fifth node or the sixth node.

8. The multi-function circuit module of claim 7, wherein when the fourth switch module conducts the fourth node and the second voltage source, the sixth switch module, the eighth switch module, and the fourth switch module act as the voltage level shifting circuit to respectively adjust voltage levels of the fifth node and/or the sixth node, so as to generate the output signal; and when the sixth switch module conducts the third node and the second voltage source, the first switch module, the seventh switch module, and the fifth switch module act as the data latching circuit to latch the voltage levels of the fifth node and the sixth node.

9. The multi-function circuit module of claim 8, wherein the sixth circuit module further comprises:
   a ninth switch element, having a control terminal coupled to the fifth node, a first terminal coupled to the first voltage source, and a second terminal coupled to the sixth node; and
   a tenth switch element, having a control terminal coupled to the sixth node, a first terminal coupled to the first voltage source, and a second terminal coupled to the fifth node;
   the seventh switch module further comprises:
   an eleventh switch element, having a control terminal coupled to the fifth node, a first terminal coupled to the third node, and a second terminal coupled to the sixth node; and
   a twelfth switch element, having a control terminal coupled to the sixth node, a first terminal coupled to the third node, and a second terminal coupled to the fifth node; and the eighth switch module further comprises:
- a thirteenth switch element, having a control terminal coupled to the first input signal, a first terminal coupled to the fourth node, and a second terminal coupled to the fifth node; and
- a fourteenth switch element, having a control terminal coupled to the second input signal, a first terminal coupled to the fourth node, and a second terminal coupled to the sixth node.

10. The multi-function circuit module of claim 9, wherein the first switch element, the second switch element, the third switch element, the fourth switch element, the fifth switch element, the sixth switch element, the seventh switch element, the eighth switch element, the ninth switch element, the tenth switch element, the eleventh switch element, the twelfth switch element, the thirteenth switch element, and the fourteenth switch element all are transistors.

11. The multi-function circuit module of claim 10, wherein the first switch element and the second switch element, the ninth switch element, and the tenth switch element all are P-type FETs, and the third switch element, the fourth switch element, the fifth switch element, the sixth switch element, the seventh switch element, the eighth switch element, the eleventh switch element, the twelfth switch element, the thirteenth switch element, and the fourteenth switch element all are N-type FETs.

12. The multi-function circuit module of claim 10, wherein the first switch element, the second switch element, the seventh switch element, the eighth switch element, the ninth switch element, and the tenth switch element all are P-type FETs, and the third switch element, the fourth switch element, the fifth switch element, the sixth switch element, the eleventh switch element, the twelfth switch element, the thirteenth switch element, and the fourteenth switch element all are N-type FETs.

13. The multi-function circuit module of claim 10, wherein the first switch element, the second switch element, the eighth switch element, the ninth switch element, and the tenth switch element all are P-type FETs, and the third switch element, the fourth switch element, the fifth switch element, the sixth switch element, the seventh switch element, the eleventh switch element, the twelfth switch element, the thirteenth switch element, and the fourteenth switch element all are N-type FETs.

14. The multi-function circuit module of claim 1, further comprising:
- a control circuit, for generating the first control signal and the second control signal, wherein when the input signal inputs a data, the control circuit firstly sets the first control signal to conduct the fourth switch module and sets the second control signal to not conduct the fifth switch module simultaneously for respectively adjusting the voltage levels of the first node and/or the second node, so as to generate the output signal; and after the multi-function circuit module has completely received the data, the control circuit then sets the second control signal to conduct the fifth switch module and sets the first control signal to not conduct the fourth switch module simultaneously to latch the voltage levels of the first node and/or the second node corresponding to the data.

15. The multi-function circuit module of claim 1, wherein the voltage level shifting circuit is a voltage level pull-up circuit, and the voltage level of the first voltage source is higher than the voltage level of the second voltage source.

16. The multi-function circuit module of claim 8, wherein the voltage level shifting circuit is a voltage level pull-up circuit, and the voltage level of the first voltage source is higher than the voltage level of the second voltage source.

17. The multi-function circuit module of claim 1, applied in a source driving chip circuit configured for driving an LCD device.

18. The multi-function circuit module of claim 8, applied in a source driving chip circuit configured for driving an LCD device.

* * * * *